United States Patent [19]
Bonora et al.

[11] Patent Number: 5,653,565
[45] Date of Patent: Aug. 5, 1997

[54] SMIF PORT INTERFACE ADAPTOR

[75] Inventors: Anthony C. Bonora, Menlo Park; William J. Fosnight, Newark; Raymond S. Martin, San Jose; Bruce C. Rhine, Fremont, all of Calif.

[73] Assignee: Asyst Technologies, Inc., Fremont, Calif.

[21] Appl. No.: 498,455

[22] Filed: Jul. 5, 1995

[51] Int. Cl.$^6$ .................................................. B65B 69/00
[52] U.S. Cl. ..................... 414/411; 414/217; 414/416; 414/786; 414/940
[58] Field of Search ........................ 414/217, 222, 414/411, 416, 940, 786; 220/601, 254, 729

[56] References Cited

U.S. PATENT DOCUMENTS

| | | | |
|---|---|---|---|
| 4,532,970 | 8/1985 | Tullis et al. | 414/940 X |
| 4,674,939 | 6/1987 | Maney et al. | 414/411 X |
| 4,676,712 | 6/1987 | Hayward et al. | 414/411 |
| 4,724,874 | 2/1988 | Parikh et al. | 414/940 X |
| 4,804,086 | 2/1989 | Grohrock | 414/940 X |
| 4,966,519 | 10/1990 | Davis et al. | 414/940 X |
| 5,037,262 | 8/1991 | Moll et al. | 414/217 X |
| 5,291,925 | 3/1994 | Marruchi | 414/217 X |

FOREIGN PATENT DOCUMENTS

| | | | |
|---|---|---|---|
| 4326309 | 9/1994 | Germany | 414/940 |
| 206547 | 7/1992 | Japan | 414/940 |
| 9014273 | 11/1990 | WIPO | 414/940 |

*Primary Examiner*—David A. Bucci
*Attorney, Agent, or Firm*—Fliesler, Dubb, Meyer & Lovejoy

[57] ABSTRACT

An adaptor plate for allowing 200 mm SMIF pods carrying one or more semiconductor wafers to be used on an access port of a wafer processing station configured to accept a 300 mm SMIF pod. The adaptor plate has a substantially circular outer circumference conforming substantially in size and shape to the outer circumference of a conventional 300 mm SMIF pod, and a central opening conforming substantially in size and shape to a conventional rectangular 200 mm SMIF pod. The one or more semiconductor wafers are supported on pod door of the pod, and the semiconductor wafers and pod door are lowered through the central opening in the adaptor plate into the wafer processing station. With the adaptor plate supported on the access port, and a cover of the 200 mm SMIF pod supported around the central opening, the access port is entirely covered and entry of contaminants into the processing station through the access port is prevented.

15 Claims, 9 Drawing Sheets

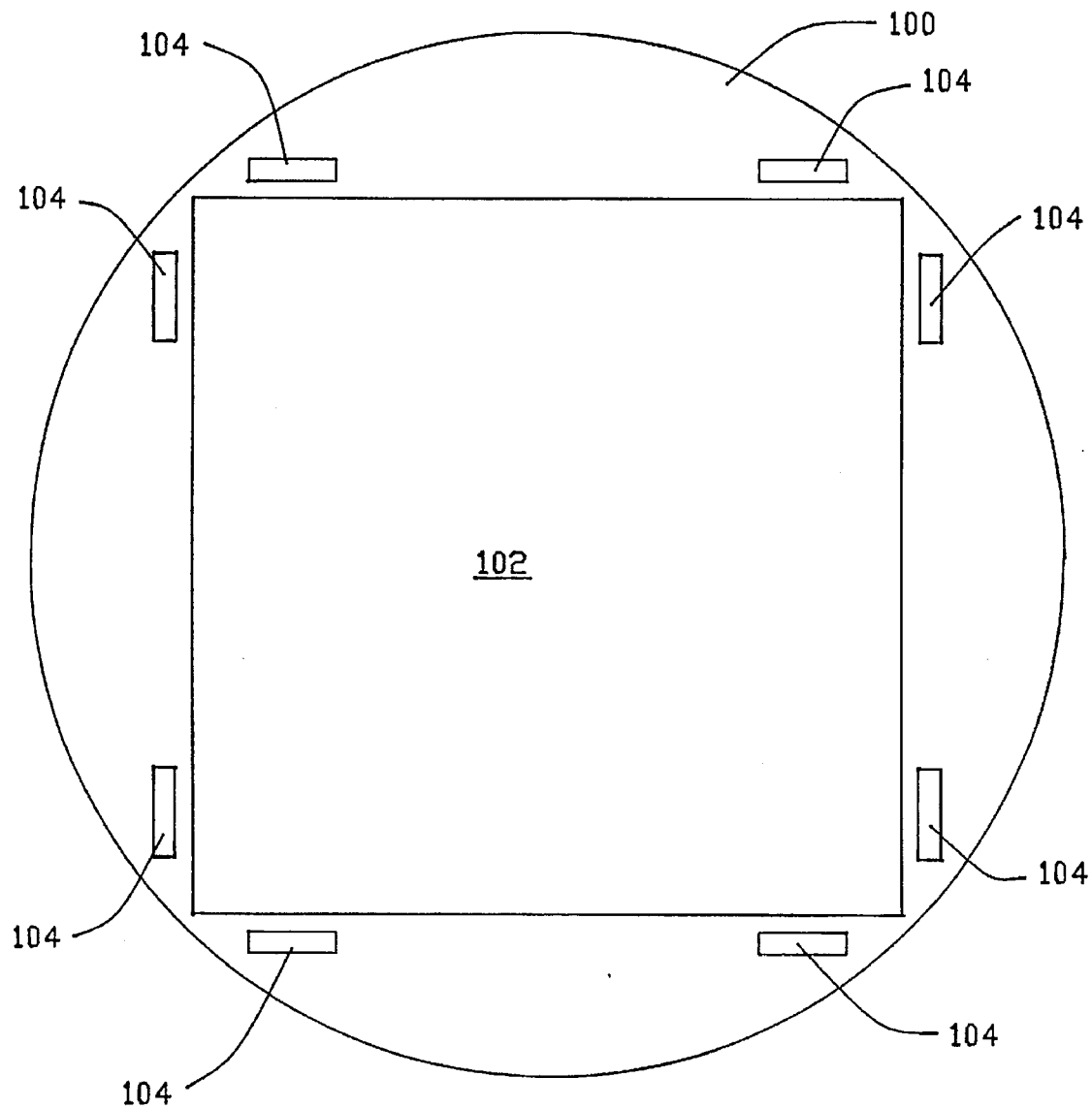
FIG.—4A
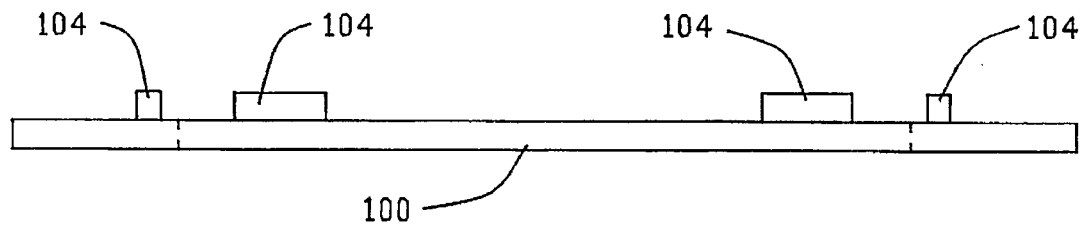
FIG.—4B

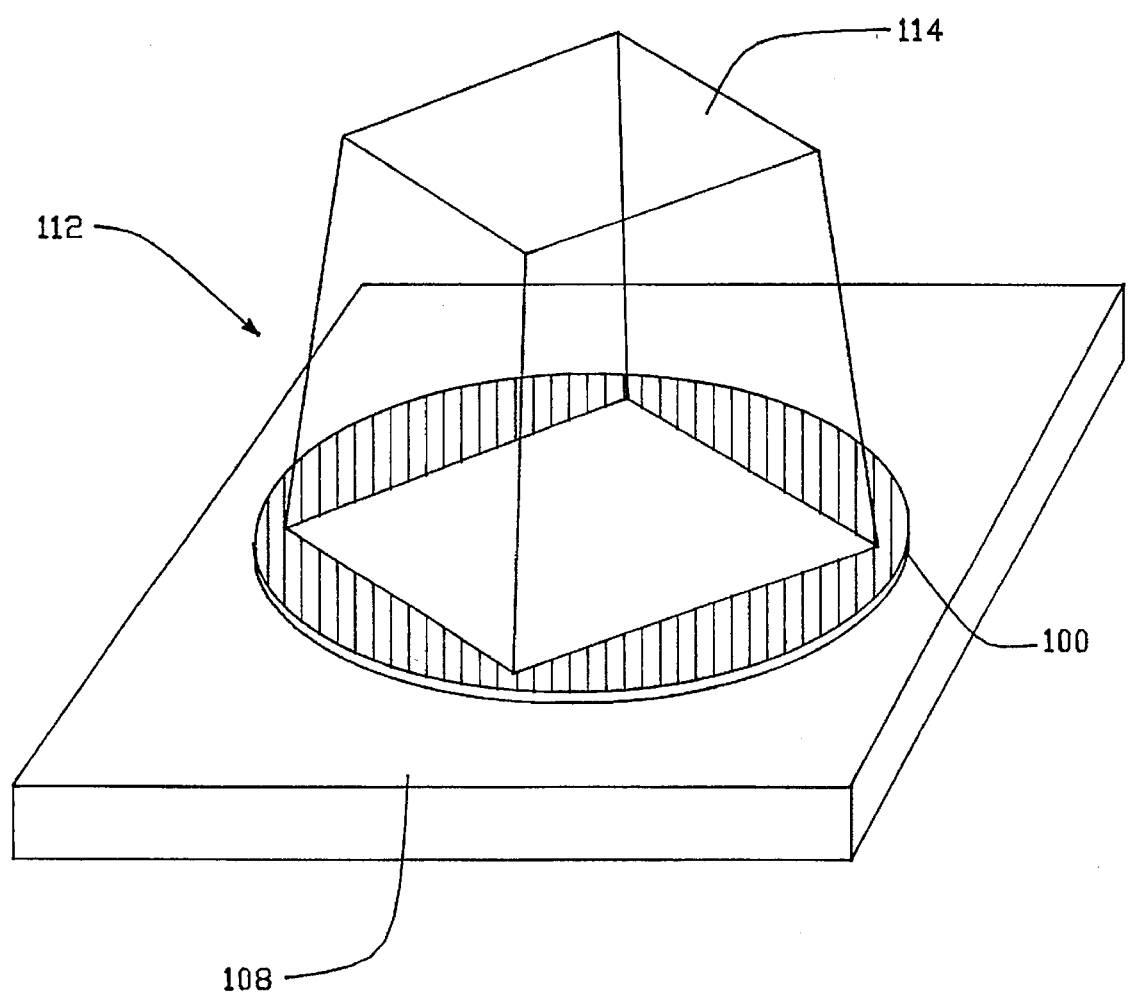
FIG.—5

SMIF PORT INTERFACE ADAPTOR

CROSS REFERENCE TO RELATED APPLICATIONS

The present invention is related to U.S. patent application Ser. No. 08/311,954, entitled "SEMICONDUCTOR WAFER CASSETTE", filed Sep. 26, 1994. This application is assigned to the owner of the present application and is incorporated by reference herein.

BACKGROUND OF THE INVENTION

1. Field of the Invention

The present invention relates to standardized mechanical interface (SMIF) systems for facilitating semiconductor wafer fabrication, and in particular to an adaptor plate for allowing 200 millimeter (mm) SMIF pods to be used on interface ports of wafer processing equipment sized to accept 300 mm SMIF pods.

2. Description of the Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers and by ensuring that particles from the ambient environment do not enter the immediate wafer environment.

The SMIF system provides a clean environment for articles by using a small volume of particle-free gas which is controlled with respect to motion, gas flow direction and external contaminants. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, Jul. 1984, pp. 111–115.

Systems of the above type are concerned with particle sizes which range from below 0.02 µm to above 200 µm. Particles with these sizes can be very damaging in semiconductor processing because of the small geometries employed in fabricating semiconductor devices. Typical advanced semiconductor processes today employ geometries which are one-half micron (µm) and under. Unwanted contamination particles which have geometries measuring greater than 0.1 µm substantially interfere with 1 µm geometry semiconductor devices. The trend, of course, is to have smaller and smaller semiconductor processing geometries which today in research and development labs approach 0.2 µm and below. In the future, geometries will become smaller and smaller and hence smaller and smaller contamination particles become of interest.

A SMIF system has three main components: (1) sealed pods, having a minimal volume, used for storing and transporting cassettes which hold the semiconductor wafers; (2) enclosures placed over cassette ports and wafer processing areas of processing equipment so that the environments inside the pods and enclosures (after having clean air sources) become miniature clean spaces; and (3) a transfer mechanism to load/unload wafer cassettes from a sealed pod without contamination of the wafers in the wafer cassette from external environments.

It has been an industry standard to fabricate semiconductors on a circular wafer having a 200 mm diameter. A plurality of these wafers may be located within wafer-carrying cassettes, which cassettes are stored and transported between processing stations in the sealed SMIF pods. A typical 200 mm cassette 20 is shown in FIG. 1, and a typical 200 mm SMIF pod 22 housing the cassette 20 is shown in FIGS. 2A through 2C. The SMIF pod 22 shown in FIGS. 2A through 2C has a base with a substantially rectangular footprint with a length (corresponding to a side of the cassette) of approximately 280 mm and a width (corresponding to a front of the cassette) of approximately 267 mm. The height of the pod may vary to accommodate higher or shorter cassettes, but a typical pod may have a height of approximately 254 mm.

In order to increase capacity in semiconductor manufacturing facilities, there is presently a movement toward standardization of a 300 mm semiconductor wafer, and equipment is being redesigned to accommodate 300 mm wafers. For example, U.S. Ser. No. 08/311,954, previously incorporated by reference, discloses a circular cassette for storing and transporting a plurality of 300 mm wafers. 300 mm SMIF pods have also been designed to house the 300 mm cassettes. One type of 300 mm pod includes a base having a circular footprint to minimize the overall size of the pod.

Regardless of size, semiconductor wafers are conventionally loaded into a processing station, such as processing equipment 24 shown in FIGS. 3A and 3B, by locating a pod 26, containing the wafer-carrying cassette, on a canopy 28 on top of the processing equipment. During transport and storage of a wafer-carrying cassette, the cassette is supported within the pod 26 on a pod door 30. The pod further includes a pod cover 32 which mates with the pod door to provide a sealed environment within the pod. When the semiconductor wafers are to be transferred into the processing equipment 24, the pod is loaded onto an access port on an upper horizontal surface of the canopy 28, such that the pod door lies in contact with a port access door 34, and the pod cover lies in contact with a port plate 36 that surrounds the port access door. The pod door and port access door are shown by the dashed lines in FIG. 3B.

Typically, after location on the canopy access port, the pod cover is decoupled from the pod door, and the pod door and port access door are lowered into the processing equipment by an elevator 38. It is also known to maintain the pod door and port access door in a stationary position, and to raise the canopy and pod cover. In either embodiment, the pod door and the port access door are preferably opened at the same time so that particles which may have been on the external door surfaces are trapped, or "sandwiched" between the doors. The elevator 38 lowers the pod door and the port access door with respect to the pod cover, with the cassette riding on the pod door, into the processing equipment. The pod cover 32 remains in a secured position on top of the access port, coveting the entire access port so that no contaminants from the environment surrounding the processing equipment 24 enter the into the equipment while the port access door is retracted from its sealing position over the access port. After processing, the reverse operation takes place.

The access port of the above described system has conventionally only been able to accept a pod of a particular size, i.e., one for which the access port is configured, so that the pod cover fully and properly seals the access port while the port access door is retracted from its sealing position over the access port. Thus for example, a 200 mm pod could not be used with conventional processing equipment sized to accept a 300 mm pod, in part because the 200 mm pod cover is too small to cover the entire canopy port, and contaminants would be allowed to enter the processing equipment when the port access door was opened. While there is a movement toward standardizing the semiconductor industry to a 300 mm wafer and equipment, even if this occurs, there will be a significant period of time where it would be advantageous to provide equipment capable of handling both 200 mm wafers and 300 mm wafers.

SUMMARY OF THE INVENTION

It is therefore an object of the present invention to provide an adaptor for allowing smaller SMIF pods, such as for example 200 mm pods, to be used on conventional 300 mm access ports on semiconductor wafer fabrication stations.

It is a further object of the present invention to allow smaller SMIF pods, such as for example 200 mm pods, to be used on larger access ports with little or no modification to the conventional 200 mm SMIF pod or access ports.

These and other objects are accomplished by the present invention, which relates in general to an adaptor plate for allowing 200 mm SMIF pods to be used on an access port of a wafer processing station canopy configured to accept a 300 mm SMIF pod. (As used herein, the designations "200 mm" and "300 mm" in reference to the pod refer to the size of the wafer contained within the pod and not the actual pod dimensions). As described in the Background of the Invention section, the access port includes a port access door and a port plate surrounding the port access door. According to the present invention, the adaptor plate has a substantially circular outer circumference conforming substantially in size and shape to the outer circumference of a conventional 300 mm SMIF pod. As such, when positioned on the access port, the adaptor plate has an outer circumferential portion lying in contact with and supported by the port plate. The adaptor plate further includes a central cutout section conforming substantially in size and shape to an outer periphery of a conventional rectangular 200 mm SMIF pod. Once the adaptor plate is positioned on the access port, a 200 mm SMIF pod may be located within the central opening of the adaptor plate such that a circumferencial edge of the pod cover lies in contact with and is supported by the adaptor plate. The port access door, however, lies entirely within the footprint of the central opening and has no portion in contact with the adaptor plate.

Once the 200 mm SMIF pod is properly located on top of the port access door and adaptor plate, the pod door may be decoupled from the pod cover by means of decoupling mechanisms conventionally provided on both the port access door and pod door. Once the pod door is separated from the pod cover, it is supported on the port access door, and the port access door and the pod door may be lowered together with respect to the pod cover into the interior of the processing station canopy by an elevator, with the wafer-carrying cassette riding on top of the pod door.

With an outer circumference of the adaptor plate lying in contact with the port plate, and a circumferencial edge of the pod cover lying in contact with an inner circumference of the adaptor plate, the access port is entirely covered and entry of contaminants into the processing station through the access port is prevented. The interior of the canopy is maintained at a higher pressure than the atmosphere surrounding canopy such that air flows from the canopy to the surrounding atmosphere to further prevent contaminants from entering through any spaces which may exist between the port plate and the adaptor plate, and the adaptor plate and pod cover, respectively. One or more securing mechanisms may be provided on the port plate to secure both the adaptor plate and the pod cover in proper position over the access port.

300 mm port access doors are conventionally provided with three protrusions for aligning with three mounts or holes on an underside of a 300 mm SMIF pod. The protrusions on the port access door and the holes on the underside of the pod door cooperate to properly align the 300 mm SMIF pod at the proper rotational orientation. The three protrusions on the port access door for a 300 mm cassette are provided such that they lie within the footprint of the door of a 200 mm SMIF pod. Thus, holes may be provided on the underside of a 200 mm SMIF pod so as to receive the three mounts conventionally provided in a 300 mm port access door so as to properly align a 200 mm SMIF pod on the port access door for entry into the processing station. While a 200 mm SMIF pod may utilize the protrusions provided on a conventional 300 mm port access door, it is understood that the present invention may operate to allow a 200 mm SMIF pod to be used on a 300 mm access port regardless of what system is provided for aligning the 200 mm pod with respect to the port access door.

BRIEF DESCRIPTION OF THE DRAWINGS

The invention will now be described with reference to the drawings in which:

FIG. 4A is a top view of an adaptor plate according to the present invention;

FIG. 4B is a side view of an adaptor plate according to the present invention;

FIG. 5 is a perspective view of an access port to a semiconductor processing station with a 200 mm SMIF pod cover and adaptor plate according to the present invention;

DETAILED DESCRIPTION

Figure 1:
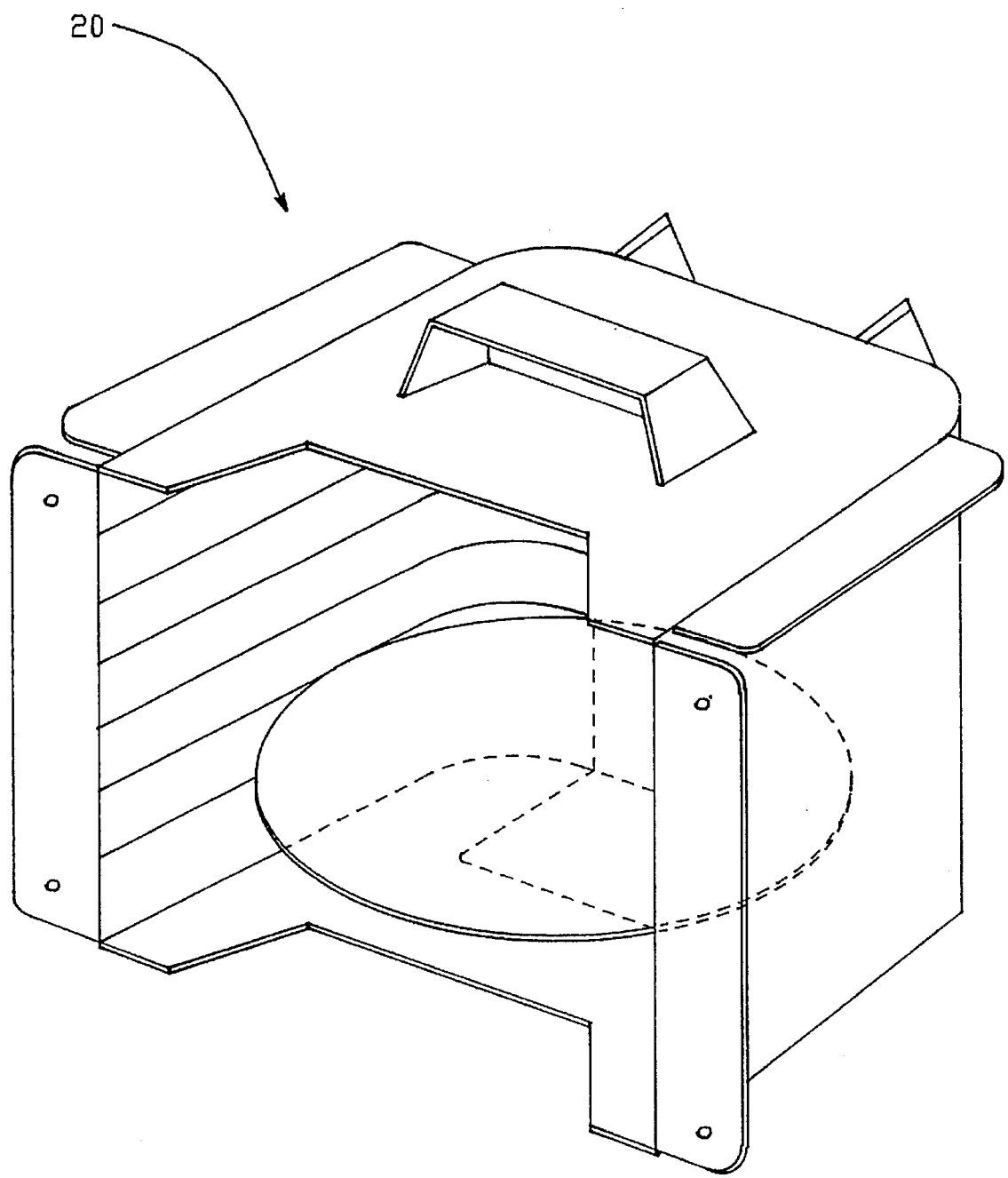
FIG. 1 is a perspective view of a conventional 200 mm semiconductor wafer cassette.
Figure 2A:
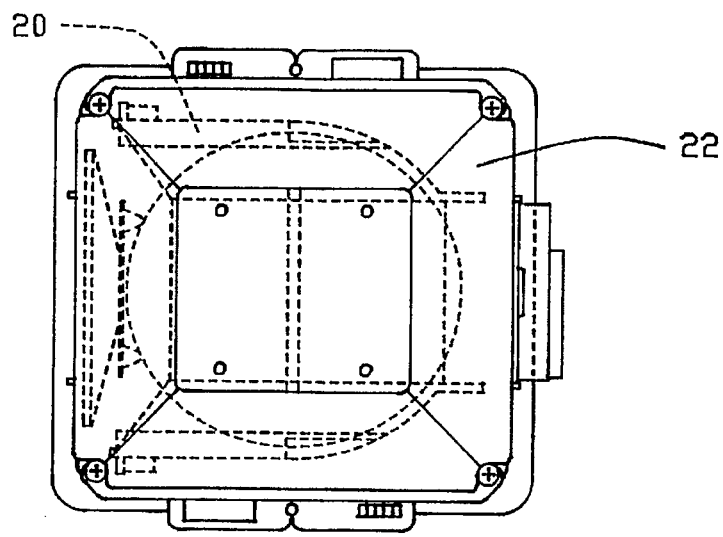
FIG. 2A is a top view of a conventional 200 mm SMIF pod.
Figure 2B:
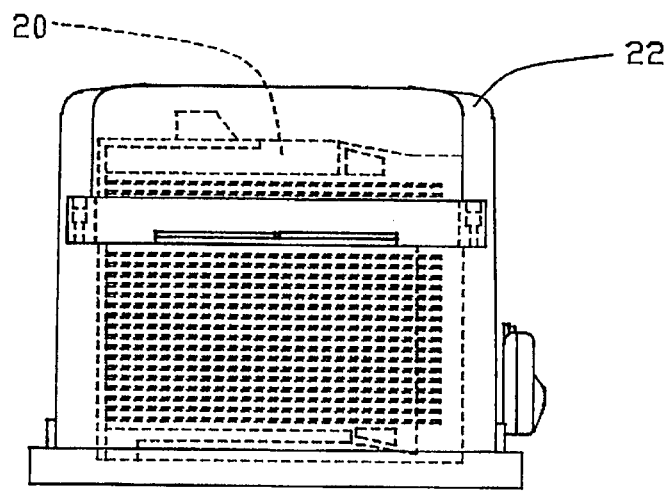
FIG. 2B is a side view of a conventional 200 mm SMIF pod.
Figure 2C:
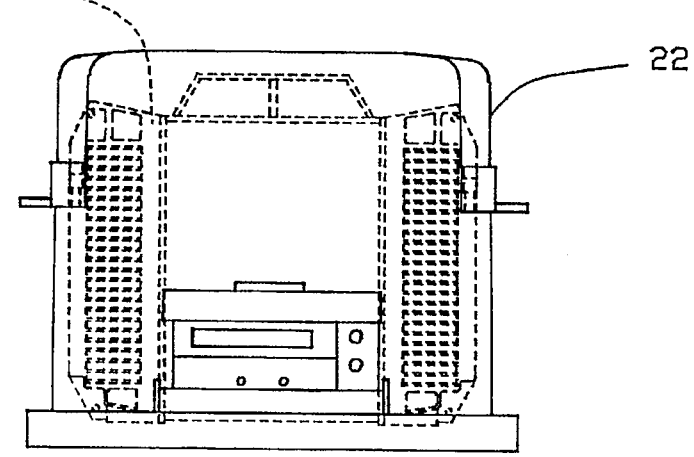
FIG. 2C is a rear view of a conventional 200 mm SMIF pod.
Figures 3A, 3B:
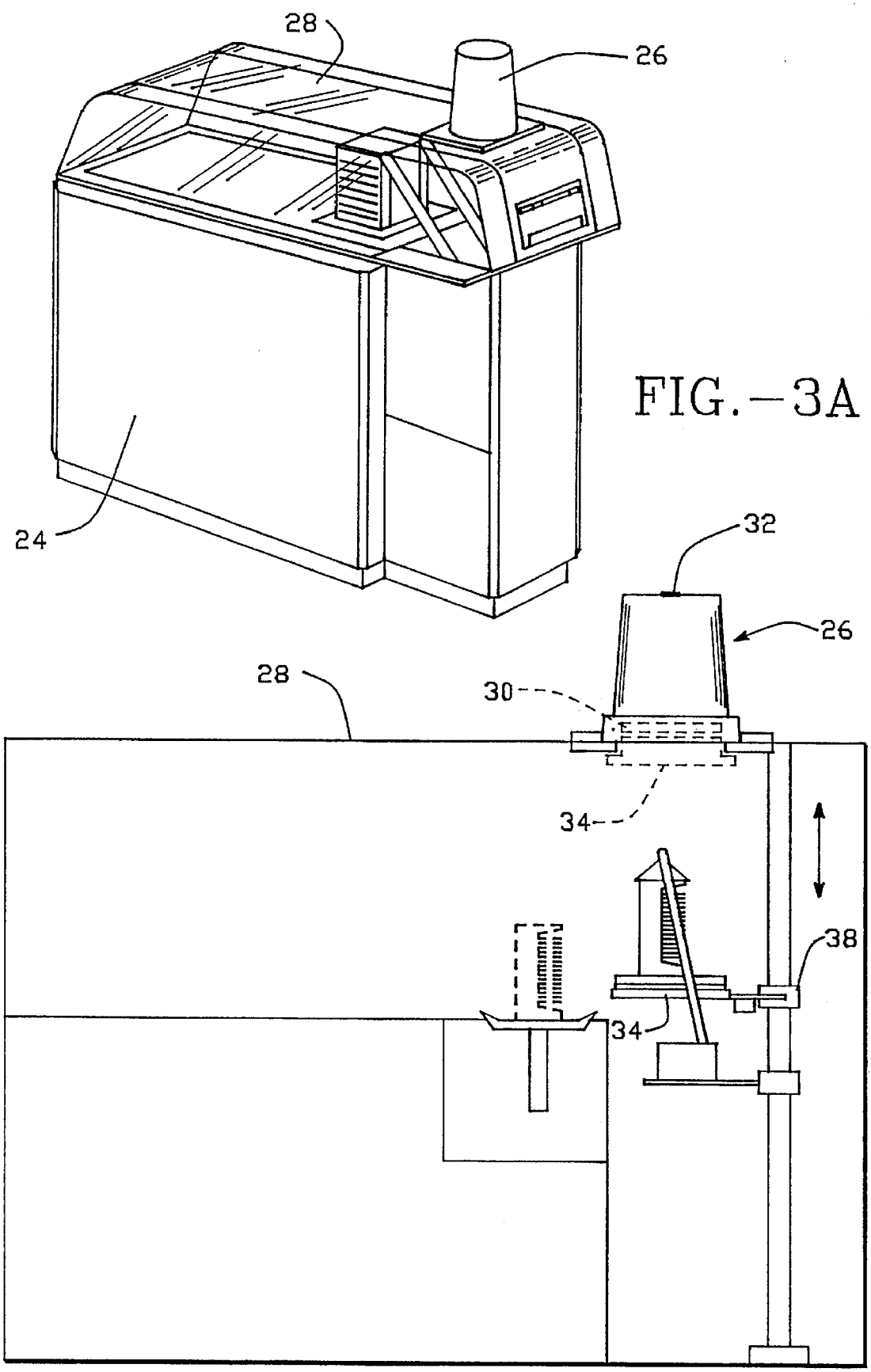
FIG. 3A is a perspective view of a semiconductor processing station.
FIG. 3B is a cross-sectional view of the semiconductor processing station shown in FIG. 3A.

The present invention will now be described with reference to FIGS. 4A through 8 which in general relate to an adaptor plate for allowing 200 mm SMIF pods to be used on an access port of a wafer processing station canopy configured to accept a 300 mm SMIF pod. While the present invention is described with regard to adapting a 200 mm pod to a 300 mm access port, it is understood that the adaptor plate according to the present invention may be configured to different dimensions to thereby adapt various sized SMIF pods to various sized wafer processing station access ports. Moreover, while the present invention is described with respect to SMIF systems, it is understood that the present invention may be used with any of various systems for transferring semiconductor wafers into a wafer processing station, such as for example a system utilizing side door pods for horizontal loading of wafers into the processing station. The term "semiconductor wafer" or "wafer" as used herein refers to a wafer substrate as it may exist in any of the various stages of the semiconductor wafer fabrication process.

FIGS. 4A and 4B show top and side views, respectively, of an adaptor plate 100 according to the present invention. In a preferred embodiment, adaptor plate 100 has an outer periphery conforming substantially in size and shape to the outer periphery of a conventional 300 mm SMIF pod. In a preferred embodiment, the outer diameter of adaptor plate 100 is substantially circular with a diameter of approximately 380 mm. However, as the size and shape of 300 mm SMIF pods may vary, it is understood that the outer periphery of adaptor plate 100 may also vary in size and/or shape in alternative embodiments. Adaptor plate 100 further includes a central opening 102 conforming substantially in size and shape to a conventional 200 mm SMIF pod. In a preferred embodiment, the central opening 102 has a length of approximately 280 mm and a width of approximately 267 mm. However, again it is understood that, as the size and shape of 200 mm SMIF pods may vary, the dimensions of the central opening 102 may also vary in alternative embodiments.

The adaptor plate 100 preferably includes substantially planar and parallel top and bottom surfaces so as to have a thickness in a preferred embodiment of approximately 1/16" to 1/8". The thickness of adaptor plate 100 may be greater or lesser than that range in alternative embodiments. The top surface of the adaptor plate 100 may include a plurality of brackets 104 protruding from the surface to properly align a 200 mm SMIF pod with respect to the adaptor plate 100 as described hereinafter. Although FIGS. 4A and 4B show each corner of the central opening having two distinct brackets 104, it is understood that each corner of the central opening may be surrounded by a single, elbow-type bracket. The adaptor plate 100 may be formed from any of several materials having high rigidity and durability such as for example, aluminum, stainless steel, or a polymer such as polycarbonate. The brackets 104 may be machined or molded onto the plate 100 or attached after formation of the plate 100 by known affixing methods. Where the brackets 104 are later attached, they may be of the same or different material than the plate 100.

Figure 6:
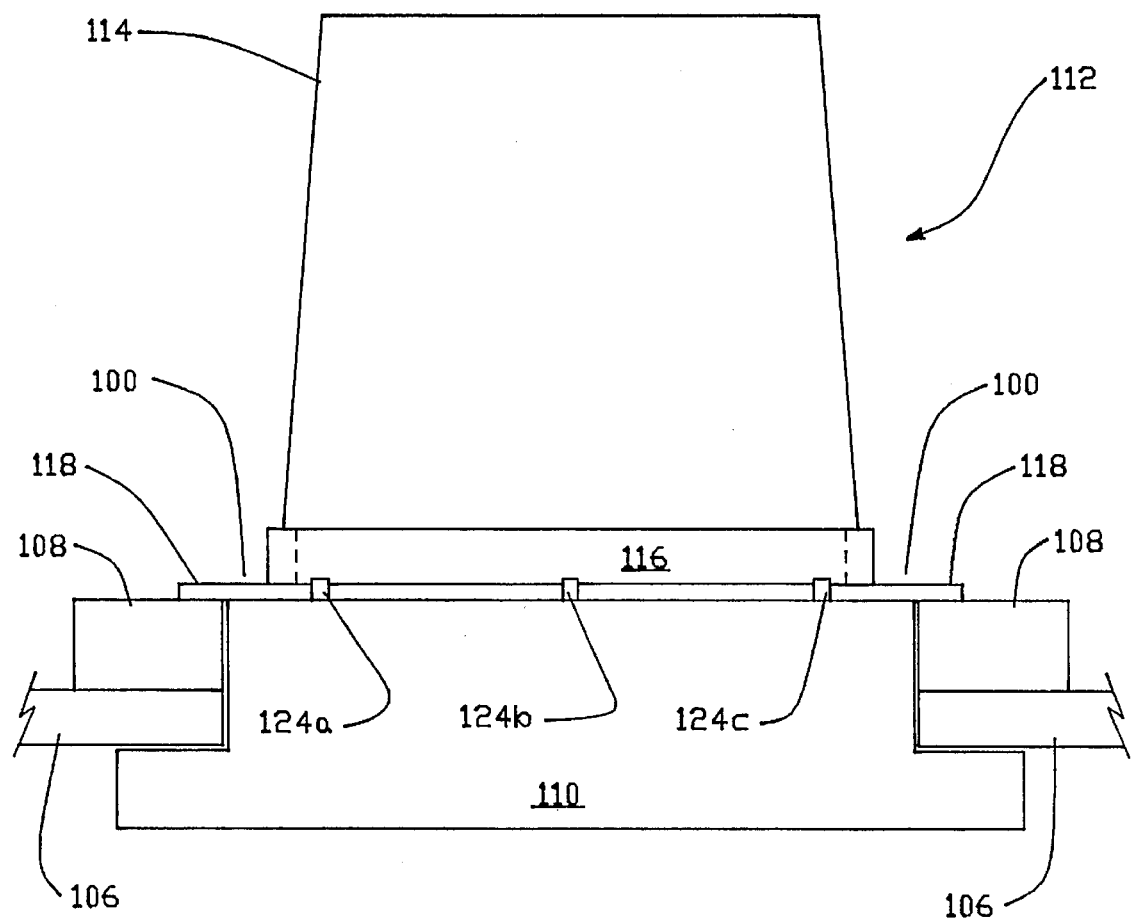
FIG. 6 is a side cross-sectional view of an access port, a 200 mm SMIF pod and an adaptor plate according to the present invention.
Figure 7:
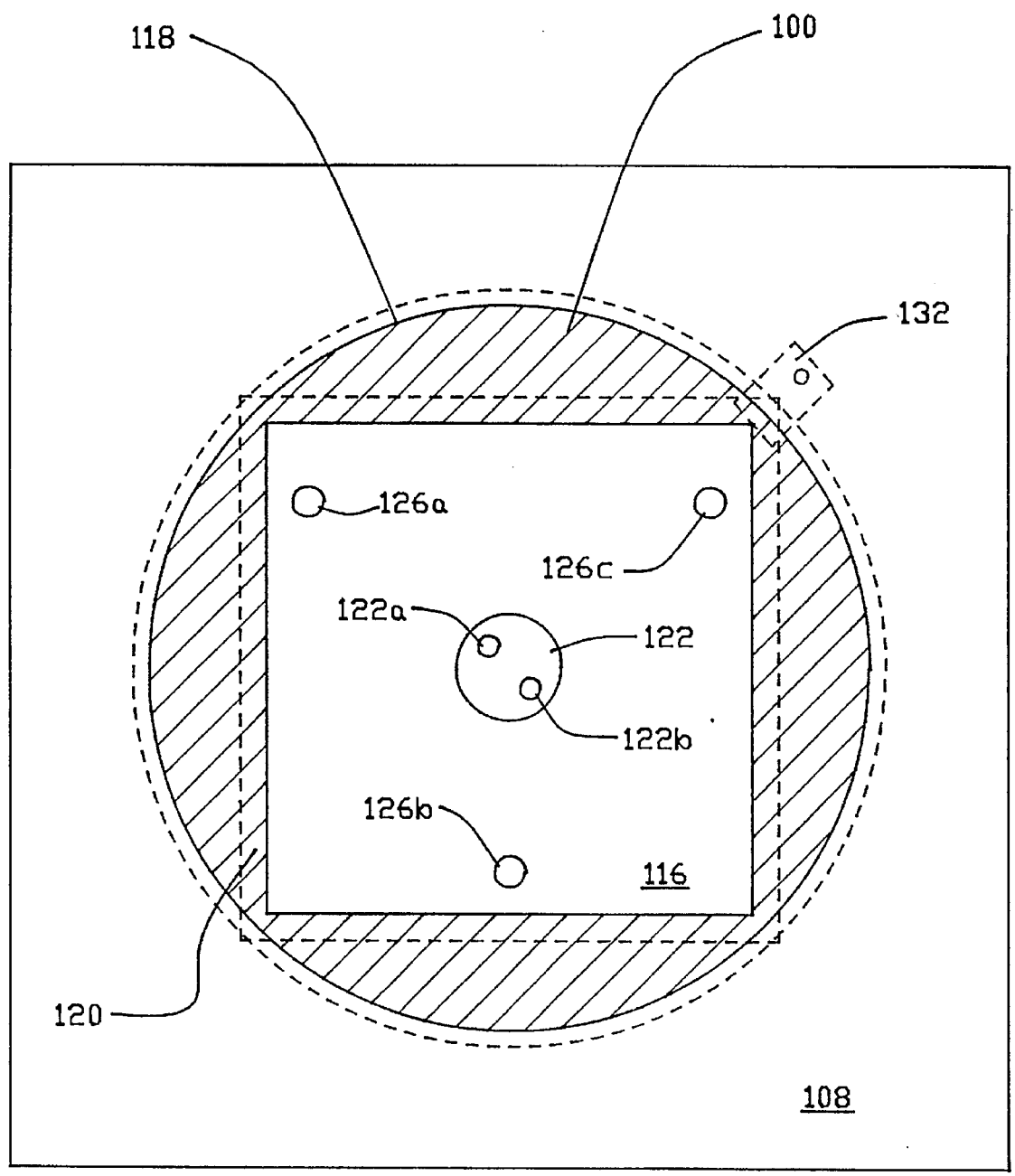
FIG. 7 is a bottom view of a port plate, a 200 mm SMIF pod door, and a port plate according to the present invention.

Referring now to FIGS. 5 through 7, as described in the Background of the Invention section, wafer processing stations include a canopy 106 (shown only partially in cross section in FIG. 6) having an access port on a top horizontal surface of the canopy through which the pod door and wafer-carrying cassette pass into the interior of the canopy. The access port includes a port plate 108 and a port access door 110 (FIG. 6). In accordance with the present invention, a 200 mm SMIF pod 112, including a pod cover 114 and a pod door 116, may operate with the access port conventionally configured for a 300 mm SMIF pod by location of the adaptor plate 100 on top of the port plate 108. The port plate 108 may include brackets (not shown) for properly aligning the adaptor plate 100 on the port plate 108 such that an outer circumferencial portion 118 (FIG. 6 and in phantom on FIG. 7) of the adaptor plate 100 lies in contact with and is supported by the port plate 108. Once the adaptor plate 100 is located on the port plate 108, the 200 mm pod 112 may be located on top of the adaptor plate 100 such that a lower circumferential edge portion 120 (in phantom on FIG. 7) lies in contact with the adaptor plate. The pod door 116, however, lies entirely within the footprint of the central opening 102 and has no portion in contact with the adaptor plate 100.

Once the pod 112 is properly located on top of the adaptor plate 100, the pod cover 114 may be separated from the pod door 116 by means of a decoupling mechanism 122 (FIG. 7) conventionally provided on the underside of the pod door. Details relating to the coupling mechanism 122 are described in greater detail in U.S. Pat. No. 4,995,430, entitled "Sealable Transportable Container Having Improved Latch Mechanism", which application is assigned to the owner of the present application and is incorporated by reference in its entirety herein. Briefly, the decoupling mechanism 122 shown on the bottom view of FIG. 7 includes two holes 122a and 122b which are engaged by a pair of protrusions provided on the port access door 110. Rotation of the protrusions rotates the decoupling mechanism 122, which in turn causes a pair of arms (not shown) within the pod door to retract from their engagement with the pod cover, thereby allowing separation of the pod cover from the pod door. The rotation of the protrusions within holes 122a and 122b may be controlled by a conventional central processing unit that controls the overall operation of the wafer processing station.

After the pod door 116 is separated from the pod cover 114 and the pod door is supported on the port access door 110, an elevator (not shown) is brought into contact with a lower surface of port access door, and the pod door 116 is lowered through the central opening 102 on top of the port access door 110. Although not critical to the present invention, it is preferred that the port access door 110 remain in contact with the pod door 116 so that contaminants on the top side of port access door 110 and the bottom side of pod door 116 are trapped therebetween.

As best shown in FIG. 5, while the pod door 116 and port access door 110 are lowered within the interior of the processing station, the access port is completely covered by the adaptor plate 100 and the pod cover 114 to prevent contaminants from entering into the interior of the processing station through the access port. The interfaces between the port plate 108 and adaptor plate 100, and the adaptor plate 100 and the pod cover 114 may not be airtight seals. As such, the atmosphere within the canopy 106 is maintained at a higher pressure than the atmosphere surrounding the canopy 106 such that there is a fluid flow from the interior of the canopy 106 to the surrounding atmosphere through the interfaces between port plate 108 and adaptor plate 100, and the adaptor plate 100 and pod cover 114, respectively. This further prevents contaminants from entering into the interior of the canopy 106. It is further contemplated that O-ring or similar type seals may be provided at the interfaces between the port plate 108 and adaptor plate 100, and the adaptor plate 100 and pod cover 114, respectively, to improve the seal between those components.

In order to properly position the 200 mm SMIF pod 112 on top of the access port, the port access door 110 includes three protrusions 124a, 124b, and 124c (FIG. 6). The protrusions 124a–c are received in corresponding holes 126a–c provided on the bottom surface of the port access door 110 (FIG. 7). The position of protrusions 124a–c may be the same regardless of whether a 200 mm pod or a 300 mm pod is used on top of the access port. As such, no customization of the port access door 110 is necessary to seat the 200 mm SMIF pod 112 on protrusions 124a–c, even though the port access door 110 and protrusions 124a–c have been configured to receive a 300 mm SMIF pod. However, it is understood that the present invention may operate to allow a 200 mm SMIF pod to be used on a 300 mm access port regardless of what system is provided for aligning the 200 mm pod with respect to the port access door. The position, configuration and/or number of members provided on the port access door and port door for aligning the pod on the port access door may vary in alternative embodiments without affecting the structure or operation of the adaptor plate 100 according to the present invention.

When a 300 mm SMIF pod is used on top of the access port, the pod door lies in near contact with the port access door. However, owing to the thickness of the adaptor plate 100, as seen in FIG. 6, in one embodiment of the invention the pod door 116 is spaced away from the port access door 110 by distance equal to the thickness of the adaptor plate 100. In order to prevent the pod door from falling onto the port access door when the pod door is decoupled from the pod cover, the holes 126a–c in the pod door may be made more shallow such that the protrusions 124a–c reside at the bottom of the holes 126a–c. Seating the protrusions at the bottom of holes 126a–c prevents the pod door from falling onto the port access door 110 upon decoupling of the pod door from the pod cover. This prevents damage to the semiconductor wafers supported on the pod door 116 that might otherwise occur if the pod door was allowed to drop onto the port access door. The depth of holes 126a–c may be for example 12 mm to 12.5 mm, as opposed to approximately a 15 mm depth conventionally provided on a 200 mm SMIF pod door. As would be appreciated by those skilled in the art, it is alternatively or additionally possible to extend the length of protrusions 124a–c so that the ends of protrusions 124a–c are seated at the bottom of holes 126a–c.

Figure 8:
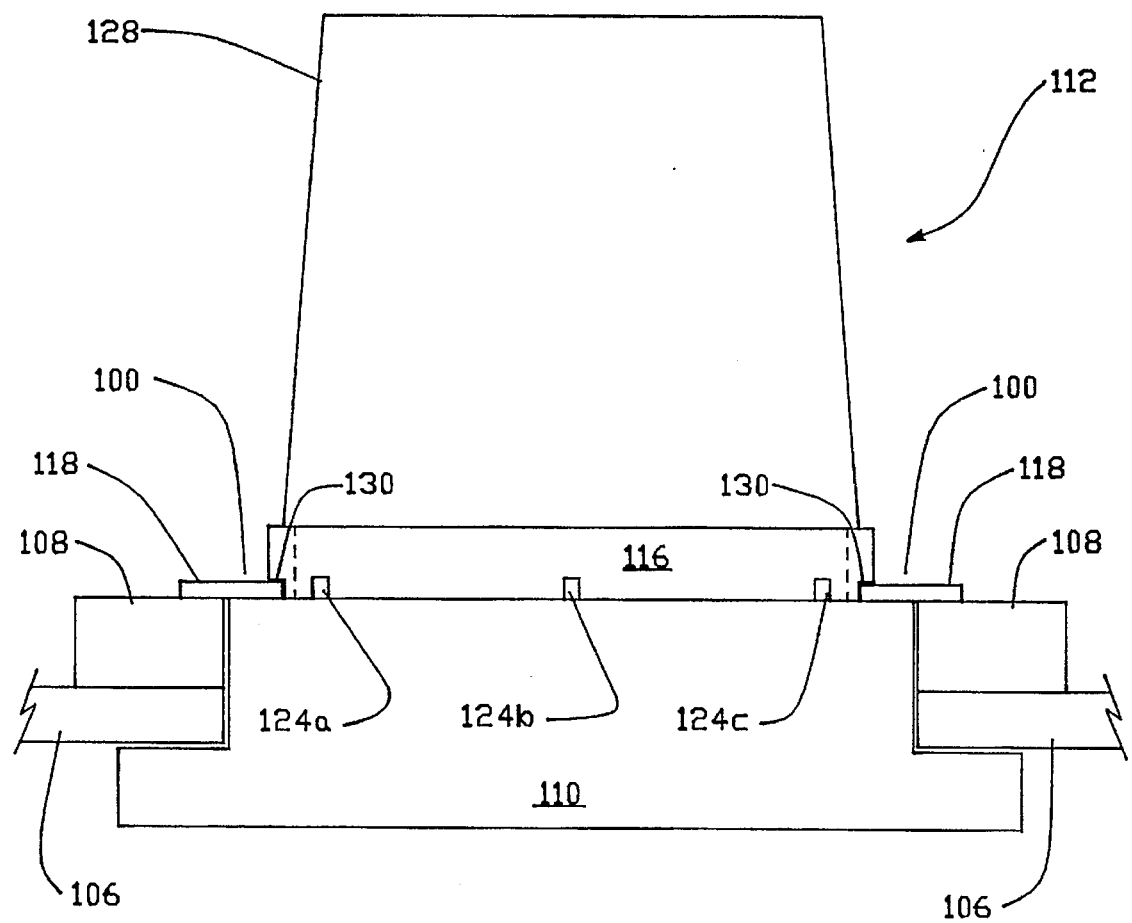
FIG. 8 is side cross-sectional view of an alternative embodiment of the invention.

In an alternative embodiment of the present invention shown in FIG. 8, the 200 mm SMIF pod 112 may include a modified cover 128 having a notched section 130 around the lower edge of the pod cover. In this embodiment, the cover 128 is supported on the adaptor plate 100 by means of the notched section 130 resting on the adaptor plate 100 around the periphery of the cover 128. The height of notched section 130 is substantially equal to the thickness of the adaptor plate 100, such that the pod door 116 lies in integral contact with the port access door 110. In this embodiment, there is no need to seat the protrusions 124a–c at the bottom of holes 126a–c.

As shown in phantom from the bottom view of FIG. 7, the top side of the port plate 108 may include a pivoting securing post 132 which is used to secure both the adaptor plate 100 and the pod cover 114 on top of the access port when the pod door 116 and port access door 110 are lowered within the interior of the canopy 106. Although one such securing post 132 is shown in FIG. 7, a securing post 132 may be provided in each of the four corners of the pod cover 114. The one or more securing posts 132 lie in contact with the corners of the pod cover 114 to thereby hold both the pod cover 114 and the adaptor plate 100 in proper position. When there is no pod 112 located on top of the access port, or when it is desired to remove the pod 112 from the access port, the one or more support members 132 are pivoted to a second position (not shown) whereby the securing members do not contact either the pod cover 114 or the adaptor plate 100. The one or more securing posts 132 may be manually pivoted between their securing and non-securing positions. Alternatively, the one or more securing posts 132 may be pivoted by a conventional motor or solenoid, the operation of which is controlled by the conventional central processing unit. The one or more securing posts 132 may be of the same configuration and in the same position(s) as the securing posts used to secure a 300 mm SMIF pod on top of the access port.

The present invention has been primarily described with respect to adapting a 200 mm SMIF pod to a top-loading 300 mm access port. However, some wafer fabrication systems employ processing stations in which wafers are accepted through an access port provided on a vertical, side surface of the processing equipment. In this embodiment, a pod having a door provided on a vertical, side surface of the pod is positioned adjacent the access port, and the pod side door and a port access door covering the access port are subsequently moved away from the access port. Thereafter, a robotic arm transfers the entire cassette or individual wafers from the pod horizontally into the wafer processing station. Pods may vary significantly in both the number of wafers within the pod and the spacing between the wafers. Therefore, in addition to having a footprint that varies in order to accommodate wafers of varying diameters (e.g., 200 mm or 300 mm), the height of a pod may also vary.

Figure 9:
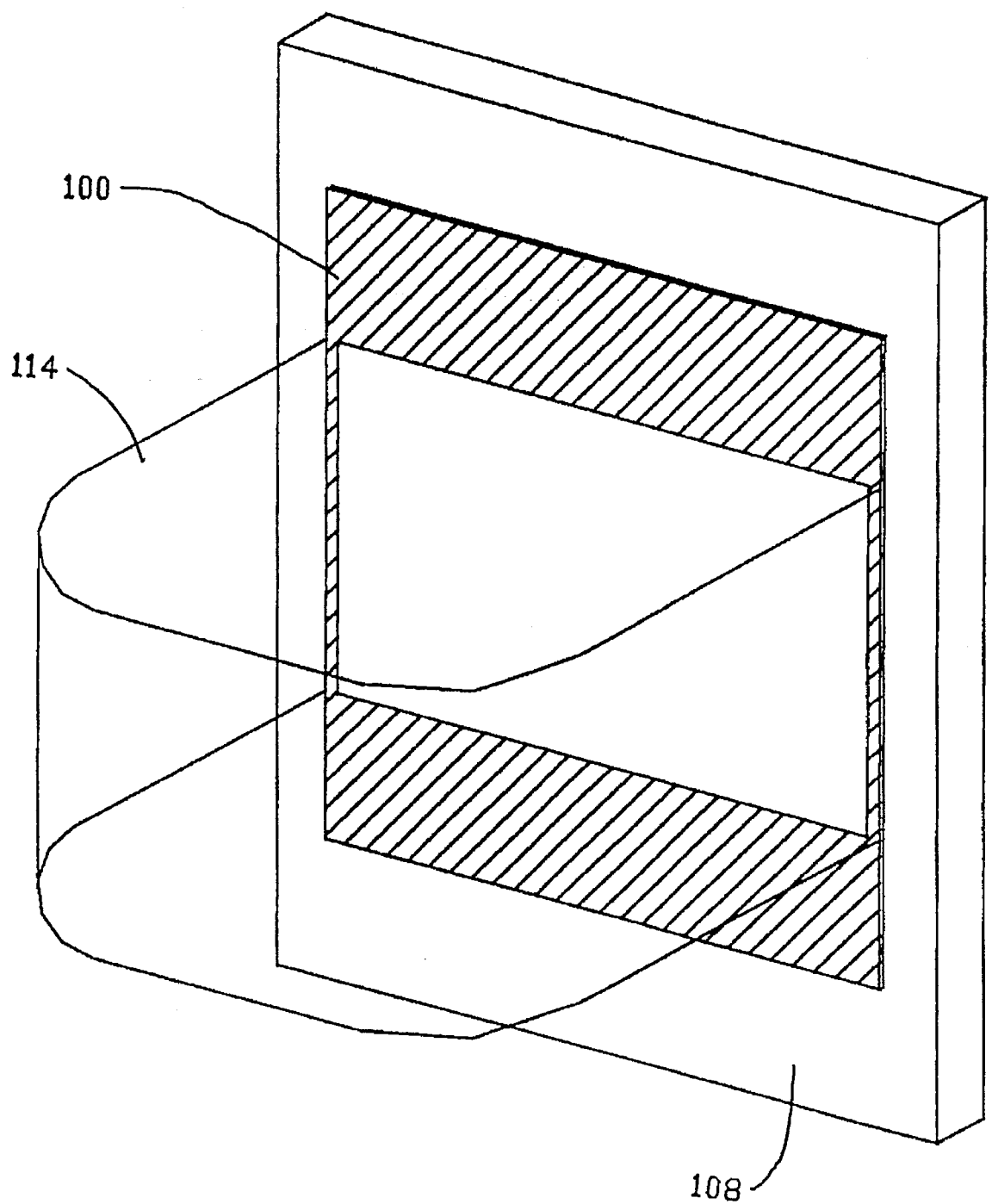
FIG. 9 is a perspective view of side opening access port to a semiconductor processing station with a SMIF pod cover and adaptor plate according to the present invention.

As shown in FIG. 9, the adaptor plate according to the present invention may also be used in connection with a side-loading system described above to allow pods of various diameters and heights to be accepted on an access port of a particular fixed size. As described above with respect to a top-loading system, an outer periphery of the adaptor plate used on a side-loading system may have substantially the same size and shape as the vertically oriented access port and may include a central opening having substantially the same size and shape as the opening in the pod through which the wafers and/or cassette are horizontally transferred into the processing equipment. The adaptor plate may be held on the vertical access port by known methods such as for example mechanical, magnetic or electromagnetic methods. As the adaptor plate according to the present invention is relatively inexpensive to manufacture, one plate may be provided for each size pod. Therefore, the adaptor plate according to the present invention may be used with either a top-loading or side-loading system to allow pods of a wide variety of sizes to be used on an access port of a particular fixed size. It is also contemplated that the central opening in adaptor plate used in the side-loading system be a substantially narrow slit sized so that only one or a few wafers may pass therethrough at a time.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. An adaptor for allowing a pod of a first size, carrying one or more semiconductor wafers, to be used with an access port of a semiconductor wafer processing station so that the one or more semiconductor wafers may be received in the wafer processing station through the access port, the access port configured to accept pods of a second size larger than the first size, comprising:

a plate for fitting over the access port, said plate including:
an outer periphery substantially conforming in size and shape to an outer periphery of the pods of the second size, and
an opening for receiving the pod of the first size, said opening substantially conforming in size and shape to an outer periphery of the pod of the first size.

2. An adaptor as recited in claim 1, wherein the pod of the first size is configured to hold 200 mm semiconductor wafers and the pods of the second size are configured to hold 300 mm semiconductor wafers.

3. An adaptor as recited in claim 1, wherein said plate and the pod of the first size completely cover the access port when located on the access port.

4. An adaptor as recited in claim 1, wherein said outer periphery is substantially circular with a diameter of approximately 254 mm and said opening is substantially rectangular with a length of approximately 280 mm and a width of approximately 267 mm.

5. An adaptor as recited in claim 1, wherein said plate has first and second substantially planar and parallel surfaces defining a thickness of said plate of approximately 1/16" to 1/8".

6. An adaptor as recited in claim 1, wherein the access port is positioned on a top, substantially horizontal surface of the semiconductor wafer processing station.

7. An adaptor as recited in claim 1, wherein the access port is positioned on a side, substantially vertical surface of the semiconductor wafer processing station.

8. A port interface system for allowing one or more 200 mm semiconductor wafers to be transferred from a pod carrying the one or more 200 mm semiconductor wafers into a semiconductor wafer processing station through an access port configured to transfer 300 mm semiconductor wafers from a pod carrying the 300 mm semiconductor wafers into the semiconductor wafer processing station, the pod carrying the one or more 200 mm semiconductor wafers including a pod door on which the one or more 200 mm semiconductor wafers are supported, and a pod cover mating with the pod door, the port interface system comprising:

a port access door capable of moving between a first position where it sealably covers the access port, and a second position where it allows the one or more 200 mm semiconductor wafers to be transferred through the access port;

a surface surrounding said port access door and substantially coplanar with said port access door when said port access door is in said first position; and an adaptor plate having an outer diameter supported on said surface, said adaptor plate including:

an outer periphery substantially conforming in size and shape to an outer periphery of the pod carrying the 300 mm semiconductor wafers, and an opening for supporting the pod cover of the pod carrying the one or more 200 mm semiconductor wafers, said opening substantially conforming in size and shape to an outer diameter of the pod carrying the one or more 200 mm semiconductor wafers;

said adaptor plate and the pod cover completely covering the access port when said port access door is in said second position.

9. A port interface system as recited in claim 8, said port access door including means for decoupling the pod cover from the pod door to allow the pod door to be transferred through the access port while the pod cover remains on top of the access port.

10. A port interface system as recited in claim 8, further comprising a plurality of protrusions on an upper surface of said port access door for being received within a plurality of holes on a lower surface of the pod door, said plurality of protrusions and said plurality of holes cooperating to align the pod carrying the 200 mm semiconductor wafers in a predetermined orientation with respect to the semiconductor wafer processing station.

11. A port interface system as recited in claim 10, wherein a position of said plurality of protrusions on said port access door is the same for aligning the pod carrying the 200 mm semiconductor wafers as it is for aligning the pod carrying the 300 mm semiconductor wafers.

12. An adaptor as recited in claim 8, wherein the access port is positioned on a top, substantially horizontal surface of the semiconductor wafer processing station.

13. An adaptor as recited in claim 8, wherein the access port is positioned on a side, substantially vertical surface of the semiconductor wafer processing station.

14. An adaptor as recited in claim 8, wherein said outer periphery is substantially circular with a diameter of approximately 254 mm and said opening is substantially rectangular with a length of approximately 280 mm and a width of approximately 267 mm.

15. A method of transferring one or more semiconductor wafers of a first size from a pod carrying the one or more semiconductor wafers of the first size into a semiconductor wafer processing station through an access port, the access port including a port access door and a port plate surrounding the port access door and the access port configured to transfer semiconductor wafers of a second size larger than the first size from a pod carrying the semiconductor wafers of the second size into the semiconductor wafer processing station, the pod carrying the one or more semiconductor wafers of the first size including a pod door on which the one or more semiconductor wafers of the first size are supported, and a pod cover mating with the pod door, the method comprising the steps of:

(a) supporting an adaptor plate on the port plate;

(b) supporting the pod cover on the adaptor plate, said steps (a) and (b) completely covering said access port;

(c) decoupling the pod cover from the pod door; and (d) lowering the pod door and the one or more semiconductor wafers of the first size through an opening in the adaptor plate and through the access port.

* * * * *